United States Patent [19]
Zavartsev et al.

[11] Patent Number: 5,970,079
[45] Date of Patent: Oct. 19, 1999

[54] LASER MATERIAL

[75] Inventors: Jury Dmitrievich Zavartsev; Alexandr Iosifovich Zagumenny; Pavel Alexeevich Studenikin; Alexandr Filipovich Umyskov, all of Moscow, Russian Federation

[73] Assignee: Tasr Limited (Tsar Ltd.), Nassau, Bahamas

[21] Appl. No.: 08/945,370

[22] PCT Filed: Feb. 14, 1996

[86] PCT No.: PCT/RU97/00030

§ 371 Date: Oct. 10, 1997

§ 102(e) Date: Oct. 10, 1997

[87] PCT Pub. No.: WO97/32375

PCT Pub. Date: Sep. 4, 1997

[30] Foreign Application Priority Data

Feb. 29, 1996 [RU] Russian Federation ............. 96104125

[51] Int. Cl.$^6$ ...................................................... H01S 3/16
[52] U.S. Cl. ................................................. 372/41; 372/39
[58] Field of Search .................. 372/40, 41, 39

[56] References Cited

U.S. PATENT DOCUMENTS 5,420,878  5/1995  Kane et al. ............................ 372/41
5,677,921  10/1997  Schaffers et al. ....................... 372/41

*Primary Examiner*—Leon Scott, Jr.
*Attorney, Agent, or Firm*—Collard & Roe, P.C.

[57] ABSTRACT

Quantum electronics are useful for materials for laser technique for use in solid state lasers with emitting wavelength of between 2.8 and 3.1 $\mu$m. It has been found possible to raise the gain of laser material, to lower the stimulation threshold for generation, to increase the generation efficiency, and to widen the available range of the industrial generating systems with continuously variable emission wavelengths in the range 2.8 –3.1 $\mu$m, including those operating in short-pulse generation and amplification modes. It is also possible to prevent fissures forming in the crystal, to reduce scattering, to improve radiation durability, to decrease dissipation, and to reduce passive absorption. The laser material has a garnet structure and contains between 0.025 formula units (f.u.) And 2.95 f.u. of holmium and in addition at least one of the following elements: Li, Be, B, Na, Ca, Mg, Si, K, Ti, V, Mn, Fe, Co, Ni, Cu, Zn, Ge, Rb, Sr, Zr, Nb, Mo, W, Ta, Hf, and Bi in quantities of between $1 \times 10^{17}$ cm$^{-3}$ to $5 \times 10^{20}$ cm$^{-3}$.

6 Claims, 4 Drawing Sheets

LASER MATERIAL

BACKGROUND OF THE INVENTION

1. Field of the Invention

The present invention relates to quantum electronics, namely to materials for laser techniques and is appropriated for an application in solid state lasers having a wavelength of a stimulated emission radiation in spectral range from 2.8 microns to 3.1 microns.

2. The Prior Art.

It is known a laser material on the halogen alkali metal crystals basis. These crystals may be used as active media for the lasers with a continuously tunable emission wavelength in three micron spectral range. [O.Zvelto, 'Principles of lasers, M., Mir (1990) 560 p.]. On the Cl:KCl and Li:RbCl crystals with $F_A$ centers work lasers emitting in 2.5÷2.9 microns and 2.7÷3.3 microns wavelength intervals, respectively.

The limitations of the halogen alkali metals crystals are a high solubility of these crystals in water and also a decay of $F_A$—centers at temperatures above 200 K. These factors cumber a practical application of this crystals in lasers with a continuously tunable emission wavelength.

It is known a material on the garnet structure crystals basis having composition which is described by chemical formula:

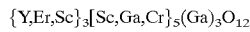

$\{Y,Er,Sc\}_3[Sc,Ga,Cr]_5(Ga)_3O_{12}$

[E. V. Zharikov, N. N. Il'ichev, S. P. Kalitin, V. V. Laptev, A. A. Saidov, V. A. Smirnov, I. A. Shcherbakov, A. F. Umyskov, "Spectral-luminescence and lasing properties of the chromium and erbium doped yttrium-scandium-gallium garnet", Kvantovay electronika, 1986, v.13, N5, pp. 975–979]. The specified material is used in lasers emitting at 2.8 microns wavelength. On this material the following laser parameters were presented: the lasing threshold is 50 J and the differential slope efficiency of lasing is 1% for free running mode laser operation, at 300 microseconds pumping pulse duration and at 30% of reflection of an output mirror (R=30%). In a cavity containing a dispersive element the lasing was achieved on the separate Stark's transitions on six wavelengths: 2.64 microns, 2.70 microns, 2.80 microns, 2.83 microns, 2.86 microns, 2.92 microns [L. A. Kulevskii, A. V. Lukashev, P. P. Pashinin, "Many-wavelength lasing at Cr:Er:YSGG crystal in the dispersion cavity", In Proceedings of All union conference "Physics and applications of solid state lasers", Apr. 16–17, 1990, M., FIAN, p.40–41].

The deficiency of the known laser material is a principled impossibility to achieve on the garnet structure containing $Er^{3+}$ ions crystals a stimulated radiation with a continuously tunable laser wavelength. The explanation of this is that the $Er^{3+}$ ions luminescence spectra consists of the separate pikes and $Er^{3+}$ ions have a small cross section value of the $^4I_{11/2} \rightarrow ^4I_{13/2}$ lasing transition in the intervals between the luminescence pikes.

Also are known the aluminum garnet crystals doped with holmium ions $\{Lu,Yb,Ho\}_3[Al,Cr]_2(Al)_3O_{12}$ [A. A.Kaminskii, A. G. Petrosyan, "Sensibilized stimulated radiation on the three microns self-saturation transitions of $Ho^{3+}$ and $Er^{3+}$ ions in $Lu_3A_5O_{12}$ crystals", I AN SSSR, seria Neorganicheskie Materialy, v.15, N 3 (1979) p.543–544]. Stimulated emission of radiation on the self-saturated three microns $^5I_6 \rightarrow ^5I_7$ transition of holmium ions was realized for the next aluminum garnet crystals containing the $Ho^{3+}$ ions:

1. A $\{Lu,Ho\}_3[Al]_2(Al)_3O_{12}$ crystal, the content of $Ho^{3+}$ ions is from 0.15 f.u. to 0.3 f.u.;
2. A $\{Lu,Yb,Ho\}_3[Al]_2(Al)_3O_{12}$ crystal, the content of $Ho^{3+}$ and $Yb^{3+}$ ions is 0.3 f.u. and 0.3 f.u., respectively;
3. $\{Lu,Yb,Ho\}_3[Al,Cr]_2(Al)_3O_{12}$ crystal, the content of $Ho^{3+}$, $Yb^{3+}$ and $Cr^{3+}$ ions is 0.3 f.u f.u. and 0.006 f.u., respectively.

The lasing was achieved at 60 microseconds pumping pulse duration by Xe-lamp ISP-250 in confocal (600 mm) optical cavity combined by dielectric mirrors. Lasing threshold was 40–60 J for (1)-crystal and 10–11 J for (2) and (3) crystals. A decreasing of a threshold was achieved as a result of addition of the $Yb^{3+}$ and $Cr^{3+}$ ions in crystal. One of the essential limitations of that laser material is that the stimulated emission of radiation was achieved at alone 2.946 microns wavelength only.

Laser material of garnet structure having the chemical formula: $\{Y,Sc,Yb,Ho\}_3[Sc,Yb,Ga,Cr]_2(Ga)_3O_{12}$ and containing Ho ions in the amount no more than 0.013 f.u. it is possible to choose as prototype of the proposed invention. [Yu.D. Zavartsev, V. V. Osiko, S. G. Semenkov, P. A. Studenikin, A. F. Umyskov, "Cascade lasing on $Ho^{3+}$ ions in the $Cr^{3+}:Yb^{3+}:Ho^{3+}$:YSGG yttrium scandium gallium garnet crystals", Kvantovay elektronika, v.20, N 4 (1993) p. 336–370]. The lasing was achieved according to the cascade scheme $^5I_6 \rightarrow ^5I_7 \; ^5I_8$ on the $Ho^{3+}$ ions in the $\{Y,Sc,Yb,Ho\}_3[Sc,Yb,Ga,Cr]_2(Ga)_3O_{12}$ crystals of garnet structure, containing 0.012 f.u. of $Ho^{3+}$ ions. The stimulated emission of radiation was demonstrated at several wavelengths for three microns spectral range ($^5I_6 \rightarrow ^5I_7$ transition of a $Ho^{3+}$ ion). The most strong pikes were at 2.84, 2.89 and 2.93 microns, the laser thresholds were 16 J, 20 J and 24 J respectively at 350 micro seconds of pumping pulse duration. The lasing was achieved at alone 2.08 micron wavelength. for two microns spectral range ($^5I_7 \rightarrow ^5I_8$ transition of a $Ho^{3+}$ ion). The laser threshold was equal 49 J.

The deficiencies of prototype are a). A low lasing efficiency in three microns spectral range, which is limited by an upconversion process and resulted in a slope laser efficiency which does not exceed 0.1%, and b) impossibility to realize a continuously tunable lasing wavelength in a wide spectral range.

SUMMARY OF THE INVENTION

The object of the invention is an increasing of an amplification coefficient of laser material, a decreasing of lasing threshold, an increasing of a slope efficiency of lasers of three microns spectral range and an expansion of the technical resources for realization of the tunable wavelength emitting for lasing in the range from 2.8 microns to 3.1 microns including lasers resources operated at oscillator and short pulse amplification modes in the spectral range from 2.8 microns to 3.1 microns. In the specific realization forms the goal of invention is also an elimination of cracking of crystal, a decreasing of dissipation, an increasing of a radiation durability, a decreasing of passive absorption in a spectral range from 0.8 microns to 1.3 microns.

A technical result is achieved in consequence of an upconversion process efficiency decreasing of the $Ho^{3+}$ ions resulted from the enhanced holmium concentration in crystal as compared with prototype. A decreasing of an upconversion process efficiency of the holmium ions leads to a rising of an efficiency of the holmium three microns lasing channel in present material as compared with analogs and prototype. A high efficiency of the holmium three microns lasing channel is a requirement for a realization of the $Ho^{3+}$ ions stimulated emission radiation with a continuously tunable emission wavelength in the spectral range 2.8–3.1 microns.

In specific realization forms the technical result, namely an increasing of a slope efficiency, a decreasing of a laser threshold, and also an increasing of a amplification coefficient of laser material, is achieved as a result of increasing of a radiation durability, an elimination of cracking of crystal, a decreasing of dissipation, a decreasing of a passive absorption in the 0.8–1.3 microns spectral range of presented material as compared with prototype by dint of an additional supplementing into the material at least one element from the group: Li, Be, B, Na, Ca, Mg, Si, K, Ti, V, Mn, Fe, Co, Ni, Cu, Zn, Ge, Rb, Sr, Zr, Nb, Mo, W, Ta, Hf, Bi. As a radiation durability and a passive absorption is determined by a vacancy presence in the oxygen sublattice of a crystal. That vacancies are formed as a result of deficiency of gallium in crystals of garnet structure. A gallium deficiency is an inherent property of the gallium garnets. [S. E. Stokowski, M. H. Randles, and R. S. Morris "Growth and Characterization of Large Nd,Cr:GSGG Crystals for High-Average-Power Slab Lasers" IEEE Journal of Quantum Electronics vol. 24 (1988) p. 934–948]. An addition into laser material the necessary quantity of the ions having the stable +4, +5 oxidation degree (for example, an addition of Si, Ti, V, Mn, Zr, Nb, Mo, Ta, Hf, Bi, W) allows to decrease the quantity of the oxygen vacancies in a crystal. An addition into the laser material the necessary quantity of the one- and two- valence impurities, such as Li, Mg, Ca, Na, B, Fe, Co, Ni, K, Cu, Be, Ge, Rb, Zn, Sr prevents a cracking of crystal, which is induced by a difference between the ion radius of vacancies and ions of elements.

The laser material based on the known crystals of garnet structure represented by the chemical formula

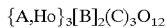

$$\{A,Ho\}_3[B]_2(C)_3O_{12}$$

where A is Yb and at least one element from the group Y, La, Ce, Gd, Lu, Sc, Tb, Eu;

Ho is a holmium element;

B is at least one element from the group Sc, Ga, In, Lu, Al, Gd Yb, Y, Cr, Tb, Eu;

C is Ga or composition of the Ga and Al elements, where the quantity of Al is not more than a half of the compound, is differentiated by the holmium content in the proposed material in the quantity from 0.025 f.u. to 2.95 f.u.

A lower limit of the holmium contents is defined on the principle that if the Ho contents is less then 0.025 f.u. a lasing efficiency becomes negligible thorough an increasing of an upconversion process as a result of which the metastable state consisting of the upper $^5S_2$ and $^5F_4$ $Ho^{3+}$ ion levels is occupied. As a result of a laser slope efficiency becomes small (less 0.1%).

An upper limit of the holmium contents is defined on the principle that at the Ho contents more than 2.95 f.u. an efficiency of a pumping energy transfer from the ytterbium to holmium ions is decreased that leads to a sharp decreasing of a slope efficiency to 0.1%.

Laser material including holmium at the designated quantity comprises additionally at least one of the element from the group Li, Be, B, Na, Ca, Mg, Si, K, Ti, V, Mn, Fe, Co, Ni, Cu, Zn, Ge, Rb, Sr, Zr, Nb, Mo, W, Ta, Hf, Bi at the quantity from $1\times10^{17}$ cm$^{-3}$ to $5\times10^{20}$ cm$^{-3}$.

A lower boundary for these elements is defined on the principle that the technical result consisting in a preventing of a cracking of crystal, in a increasing of a radiation durability and a decreasing of a passive absorption in 0.8–1.3 microns spectral range is not achieved at the lower concentrations than the designated limit.

An upper limit for these elements is defined by a maximum possible their contents in crystals of the garnet structure. The disruption of garnet structure occurs if the element contents exceed a designated limit.

DETAILED DESCRIPTION OF PREFERRED EMBODIMENTS

Figure 1:
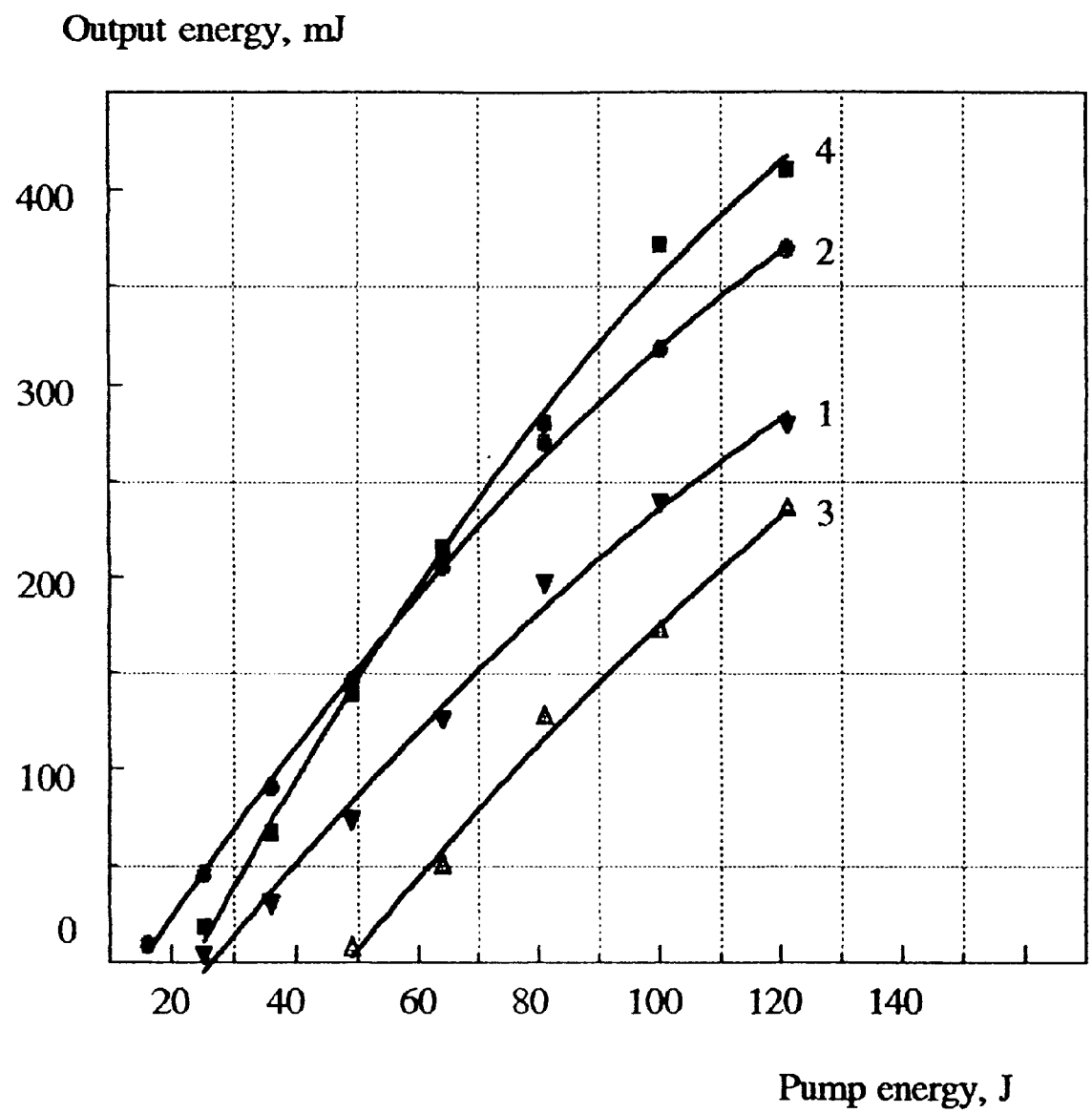
FIG. 1 shows the output energy as a function of the pump energy.

FIG. 1 presents the dependence of the lasing energy of a N 3 crystal upon the pump energy for free rnning mode operation at 300 microseconds pumping pulse duration and at the different reflectivity of an output mirror (R) (curve 1 is for R=30% and curve 2 is for 80%). For comparison on FIG. 1 is presented the results of the investigations which were fulfilled in the same conditions of the laser experiment for active element of the same size made from the $\{Y,Er,Sc\}_3[Sc,Cr,Ga]_2(Ga)_3O_{12}$ crystal (curves 3 and 4 for R=30% and R=80%, respectively). This crystal is a second analog mentioned above.

Comparison of the energy characteristics of the lasers shows that at the different reflection coefficients of the output mirrors the laser made on the N 3 crystal has less lasing threshold and the best efficiency at low pumping level comparing with the $\{Y,Er,Sc\}_3[Sc,Cr,Ga]_2(Ga)_3O_{12}$ analog. Besides, the lasing threshold of the N 3 crystal to a lesser degree depends on an output mirror reflection coefficient, that points out at the more high amplification coefficient and accordingly the higher cross-section of a transfer.

Figure 2:
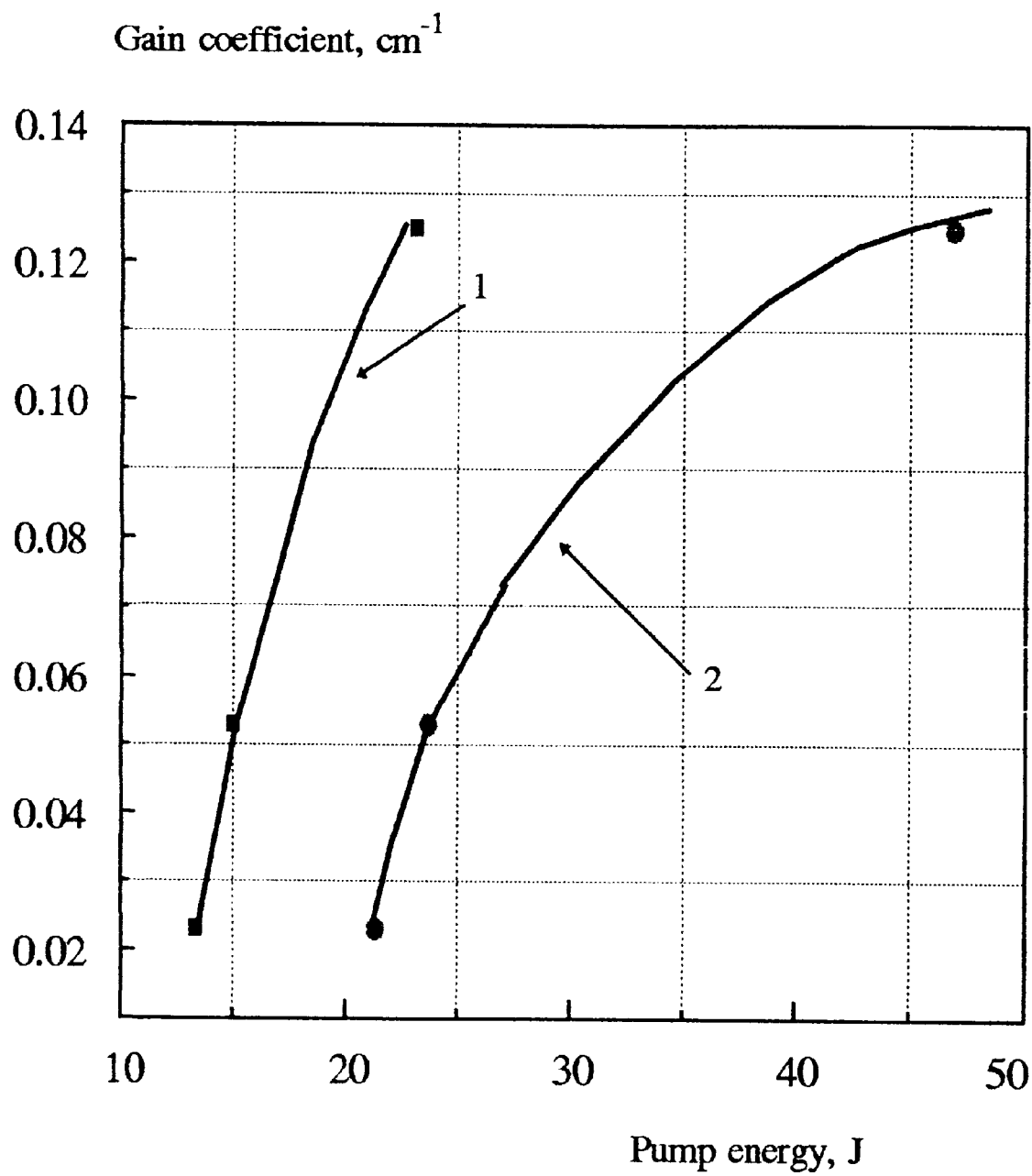
FIG. 2 shows the gain coefficient as a function of the pump energy.

FIG. 2 shows the dependence of the amplification coefficient in the N 3 crystal (curve 1) and the $Er^{3+}$:$\{Y,Sc\}_3[Sc,Cr,Ga]_2(Ga)_3O_{12}$ crystal (2 curve) upon the pumping energy. The N 3 crystal has a higher gain.

Figure 3:
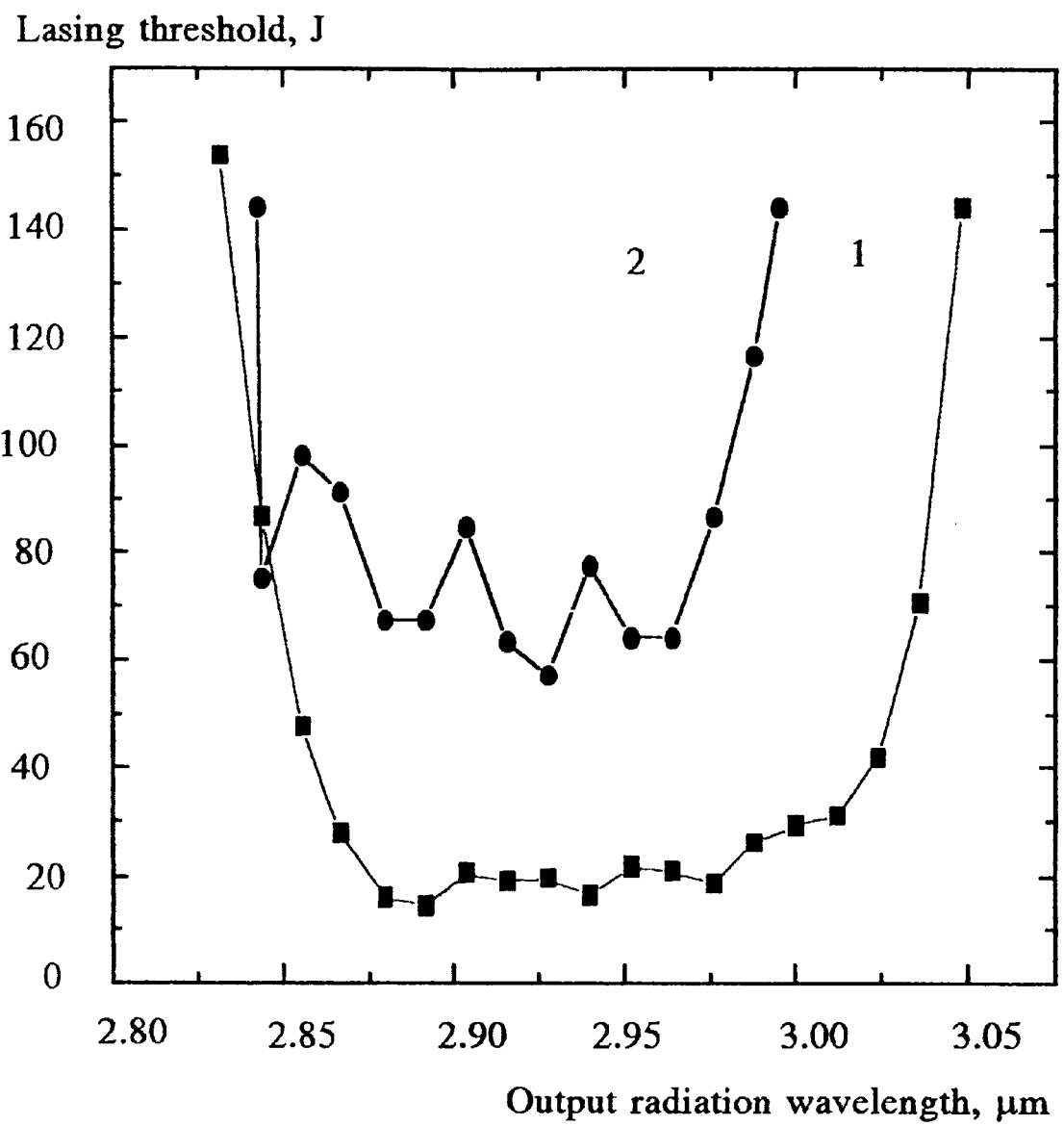
FIG. 3 shows the lasing threshold as a function of the output radiation wavelength.

FIG. 3 presents the dependence of the lasing threshold of the N6 crystal on the emission wavelength for a totally nontransmitting cavity (1 curve) and for a cavity with the output mirror characterized by R=30% (2 curve). Obtained data show that continuous tuning of the emission wavelength was possible in the range 2.83–3.05 microns when for a totally nontransmitting cavity (curve 1) and in the range 2.84–3.00 microns when the reflectivity of the output mirror was 30% (2 curve ). The width of the emission line was less than 30 nm.

Figure 4:
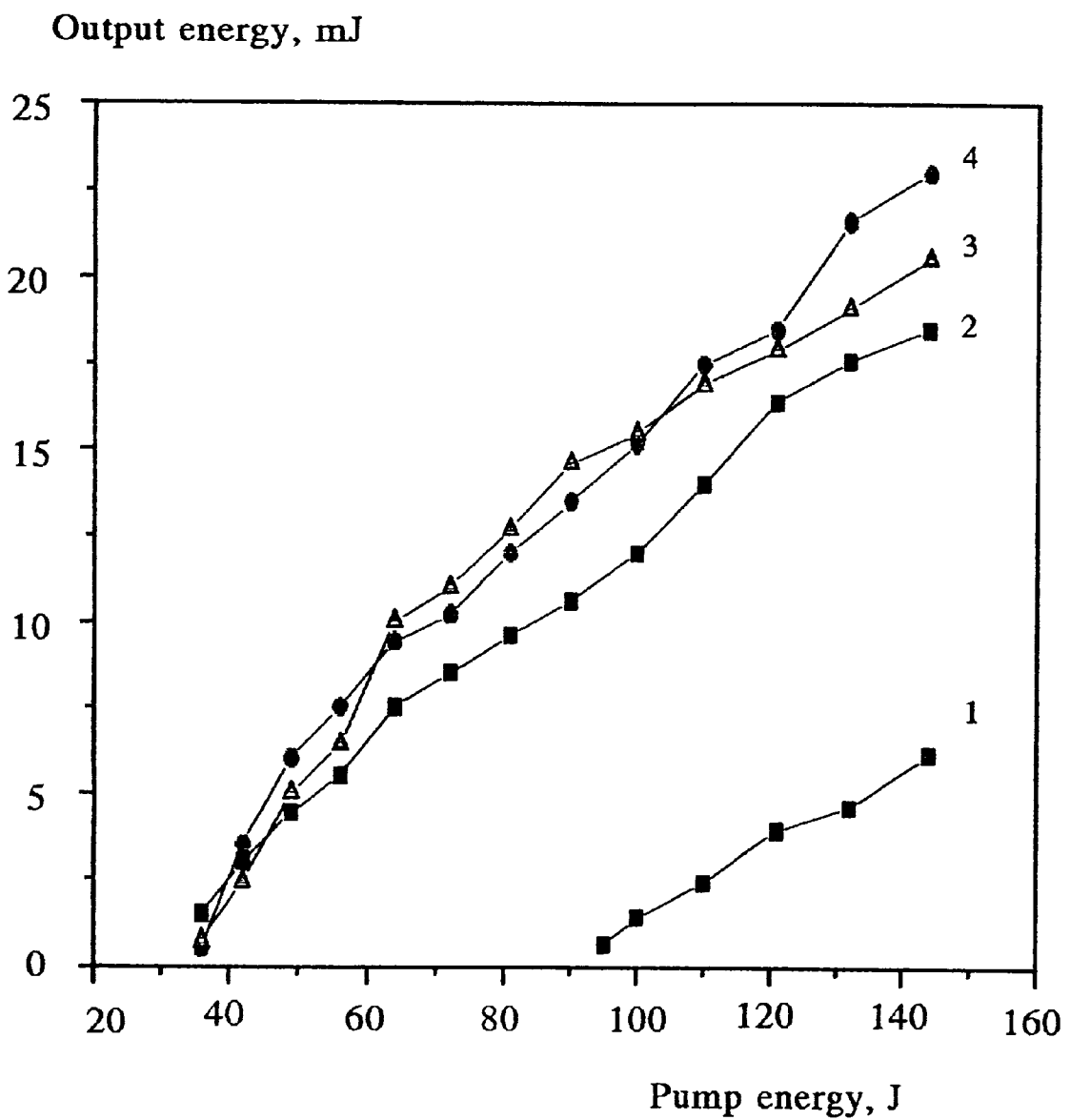
FIG. 4 shows the output energy as a function of the pump energy.

FIG. 4 gives the output energy of lasing on the N 5 crystal versus pump energy for free running mode operation when the emission took place at the different wavelengths (1 curve is at 2.988 microns, 2 curve is at 2.856 microns, 3 curve is at 2.940 microns, 4 curve is at 2.892 microns). The pumping pulse duration was 300 microseconds, the output mirror reflectivity was equal 60%. For the output radiation wavelength selection the Ge prism was used in the laser cavity as dispersion element. A reduction in the lasing efficiency compared with a generation without dispersive element was associated with two-photon absorption in the prism material and with the losses at the prism faces as a result of depolarization of radiation. However, these technical problems do not belong to the laser material, they can be avoided by selecting a suitable prism material and optimizing of the cavity configuration.

The growth of the garnet structure crystals were executed by means of a conventional process of a pulling from a melt. For example, for the production of the gadolinium ytterbium holmium yttrium terbium scandium gallium garnet crystal represented by the chemical formula $\{Gd,Yb,Ho,Y,Tb,Sc\}_3 [Sc,Ga]_2(Ga)_3O_{12}$ comprising additionally silicon and magnesium was used in next manner: oxide starting materials of gadolinium oxide, ytterbium oxide, holmium oxide, yttrium oxide, terbium oxide, scandium oxide, gallium oxide were precisely mixed, pressed into a tablet form, and synthesized in platinum crucible at 1200° C. during 10 hours. Thereafter the tablets were melted in an iridium crucible in a hermetic chamber in 98 vol. % $N_2$+2 vol. % $O_2$ atmosphere by an inductive heating. Before a crystal growth process the silicon and magnesium oxides were added into the melt. The crystals were pulled from the melt of 300 cm³ volume crystal pulling rate of 4 mm/hr and a rotation rate of 40 round per minute the grown crystals were gradually cooled to the room temperature during 40 hours after a tearing away from the melt.

The examples of the specific compositions of the grown crystals and the prototype are adduced in Table 1 of the drawings.

The experimental investigations of the lasing characteristics were fulfilled on active elements produced from the grown crystals. The active element was a rods 4 mm in diameter and 55 mm long. The laser rods of the same size were made of the $\{Y,Sc,Yb,Ho\}_3[Sc,Yb,Ga,Cr]_2(Ga)_3O_{12}$ prototype and $\{Y,Er,Sc\}_3[Sc,Cr,Ga]_2(Ga)_3O_{12}$ analog crystals (there is the analog which does not comprise the holmium ions, but has the best lasing parameters of three microns spectral range generation among the known crystals of garnet structure) for comparison of lasing parameters. The laser rods had plane—parallel ends which were not the antireflection coated. The capacitance of the storage capacitors was 200 μF. Laser rod was pumped by an INP-5/45 flashlamp in an elliptic fused silica enclosure of 28×30×50 mm dimensions. The illuminated part of the crystal was 48 mm. The system was cooled with a 0.1% distilled-water solution of potassium dichromate.

To achieve the lasing on the separate wavelengths of three micron spectral range a laser cavity 200 mm long was used. A cavity was formed by a copper spherical mirror (radius of curvature 1000 mm), and a dielectric mirror which was either plane with R=30% or spherical (radius curvature 1000 mm) with R=80%.

At the described conditions of the lasing experiments the laser based on a garnet structure holmium doped crystal has a lower lasing threshold and a higher efficiency at low pumping rates compared with an erbium containing crystal FIG. 1, and besides it has a higher gain and, consequently, a larger a transition cross-section. Lasing involved several Stark sublevels participating in the $^5I_6 \rightarrow ^5I_7$ transition. The lasing wavelengths were: $\lambda_1$=2.842 μm, $\lambda_2$=2.888 μm, $\lambda_3$=2.926 μm, $\lambda_4$=2.962 μm, $\lambda_5$=2.973 μm, $\lambda_6$3.057 μm. The output energy was distributed between these wavelengths in the ratio corresponding to 11%, 7%, 44%, 18%, 18% and 2%, respectively. The measurements were carried out ignoring the difference between the absorption at these wavelengths in air over an optical path 2.5 m long.

The gain for an active media was calculated from the values of a pumping energy threshold obtained for different reflection coefficients of the output mirrors. The results of calculation of the gains at 25 J pumping energy for different composition crystals are presented on FIG. 2 and compiled in Table 2 of the drawings.

To achieve the lasing with a continuously tuning of the emission wavelength in the range 2.8 μm–3.1 μm a laser cavity was formed by a plane dielectric mirror with R=99.8% and either a copper or dielectric mirror with R=30% or R=60%, respectively. Ge prism was used as intracavity dispersive component. The mirror rotation was used to tune the output radiation wavelength. The radiation struck the prism face at the Brewster angle and after partial reflection from the face reached a photodetector used to monitor the lasing threshold. A He-Ne laser beam was directed onto the mirror used to tune the emission wavelength of the crystal laser. The emission wavelength was deduced from the position of the reflected He-Ne beam on a special scale. A scale was calibrated with a monochromator and photodetector when a lasing was performed with R=30% output mirror cavity. For a totally nontransmitting cavity formed with R =99.8% output mirrors a laser allows to tune continuously the output radiation wavelength in the range 2.83 μm–3.05 μm. When the reflection coefficient of the output mirror was 30%, continuous tuning of the emission wavelength was possible in the range 2.84–3.00 μm FIG. 4. The width of the lasing line was less than 0.03 μm For comparison of the characteristics of the grown crystals and prototype and also the results of the lasing test are adduced in Table 2 of the drawings.

We claim:

1. A laser material for a solid state laser that, when pumped, emits electromagnetic radiation with a wavelength in the range λ=2.8–3.1 mm, the material comprising:

a solid state body of holmium garnet containing at least one element selected from the group consisting of Li, Be, B, Na, Ca, Mg, Si, K, Ti, V, Mn, Fe, Co, Ni, Cu, Zn, Ge, Rb, Sr, Zr, Nb, Mo, W, Ta, Hf, and Bi at the quantity from $1\times10^{17}$ element per cm³ to $5\times10^{20}$ element per cm³ and having the approximate chemical composition $\{A_{3-x}, Ho_x\}[B]_2 (C)_3O_{12}$ wherein A is Yb and at least one element selected from the group consisting of Y, La, Ce, Gd, Lu, Sc, Tb, and Eu;

B is at least one element selected from the group consisting of Sc, Ga, In, Lu, Al, Gd, Yb, Y, Cr, Tb, and Eu;

X is in the range 0.025≦x≦2.95;

C is selected from the group consisting of Ga and a Ga and Al composition having the contents of Al up to a half of the composition.

2. The laser material of claim 1, wherein C is Ga.

3. The laser material of claim 1, wherein C is the Ga and Al composition.

4. A laser material for a solid state laser that, when pumped, emits electromagnetic radiation with a wavelength in the range λ=2.8–3.1 mm, the material comprising:

a solid state body of holmium garnet containing at least one element selected from the group consisting of Li, Be, B, Na, Ca, Mg, Si, K, Ti, V, Mn, Fe, Co, Ni, Cu, Zn, Ge, Rb, Sr, Zr, Nb, Mo, W, Ta, Hf, and Bi at the quantity from $1\times10^{17}$ element per cm³ to $5\times10^{20}$ element per cm³ and having the approximate chemical composition $\{A_{3-x}, Ho_x\}[B]_2(C)_3O_{12}$ wherein A is Yb and at least one element selected from the group consisting of Y, La, Ce, Gd, Lu, Sc, Tb, and Eu;

B is at least one element selected from the group consisting of Sc, Ga, In, Lu, Al, Gd, Yb, Y, Cr, Tb, and Eu;

X is in the range 0.025≦x≦2.95;

C is selected from the group consisting of Ga and $Ga_{1-y}Al_y$, where y is a positive number up to 0.5, inclusively.

5. The laser material of claim 4, wherein C is Ga.

6. The laser material of claim 4, wherein C is $Ga_{1-y}Al_y$ where y is a positive number up to 0.5, inclusively.

* * * * *

UNITED STATES PATENT AND TRADEMARK OFFICE
CERTIFICATE OF CORRECTION

PATENT NO. : 5,970,079
DATED : October 19, 1999
INVENTOR(S) : ZAVARTSEV ET AL

It is certified that error appears in the above-indentified patent and that said Letters Patent is hereby corrected as shown below:

On the title page, column 1, item [73], please change

"Tsar Ltd." to --Tasr Ltd.--.

Item [22}, change "1996" to --1997--.

Signed and Sealed this

Third Day of April, 2001

Attest:

NICHOLAS P. GODICI

Attesting Officer     Acting Director of the United States Patent and Trademark Office

UNITED STATES PATENT AND TRADEMARK OFFICE
CERTIFICATE OF CORRECTION

PATENT NO.     : 5,970,079
DATED          : October 19, 1999
INVENTOR(S)    : Zavartsev et al.

It is certified that error appears in the above-identified patent and that said Letters Patent is hereby corrected as shown below:

Drawings,
Insert Table 1 and Table 2 before Fig. 1 as attached hereto.

Signed and Sealed this

Ninth Day of July, 2002

Attest:

JAMES E. ROGAN
Attesting Officer       Director of the United States Patent and Trademark Office TABLE 1. The examples of specific compositions of grown crystals and prototype.

| Crystal | Prototype | N 1 | N 2 | N 3 | N 4 | N 5 | N 6 | N 7 |
|---|---|---|---|---|---|---|---|---|
| | f. u. | f. u. | f. u. | f. u. | f. u. | f. u. | f. u. | f. u. |
| $Ho_2O_3$ | 0.012 | 0.027 | 0.06 | 0.191 | 1.2 | 1.8 | 2.3 | 2.5 |
| $Yb_2O_3$ | 1.5 | 1.8 | 1.5 | 1.5 | 0.2 | 0.4 | 0.6 | 0.4 |
| $Y_2O_3$ | 1.488 | 0.7 | 0.44 | 1.309 | | 0.4 | | |
| $Tb_2O_3$ | - | 0.003 | | | | | | 0.01 |
| $Gd_2O_3$ | - | 0.47 | | | 1.43 | | 0.1 | 0.04 |
| $Lu_2O_3$ | - | | 1.0 | | 0.4 | 0.5 | | |
| $Sc_2O_3$ | 1.4 | 1.43 | | 1.4 | | 1.3 | 1.43 | 1.45 |
| $Eu_2O_3$ | - | | | | 0.01 | | | |
| $La_2O_3$ | - | | 1.2 | | 0.2 | 0.1 | | |
| $Cr_2O_3$ | 0.048 | | | 0.032 | 0.012 | 0.024 | 0.036 | 0.072 |
| $Ga_2O_3$ | 3.552 | 3.57 | 3.75 | 3.568 | 3.548 | 3.176 | 3.534 | 3.528 |
| $Al_2O_3$ | - | | 0.05 | | 1.0 | 0.3 | | |
| | | $cm^{-3}$ | $cm^{-3}$ | $cm^{-3}$ | $cm^{-3}$ | $cm^{-3}$ | $cm^{-3}$ | $cm^{-3}$ |
| CaO | - | | $6.0 \times 10^{18}$ | | | | $8.0 \times 10^{17}$ | |
| $SiO_2$ | - | $3.8 \times 10^{17}$ | $6.4 \times 10^{18}$ | | | | | $2.0 \times 10^{17}$ |
| $TiO_2$ | - | | | $2.5 \times 10^{19}$ | | | $2.0 \times 10^{18}$ | $8.0 \times 10^{18}$ |
| CuO | - | | | | | $1.0 \times 10^{17}$ | | |
| MgO | - | $4.3 \times 10^{17}$ | | | | | | |
| $Li_2O$ | - | | | | $1.0 \times 10^{17}$ | | | $5.0 \times 10^{18}$ |
| $HfO_2$ | - | | $1.0 \times 10^{19}$ | | $2.0 \times 10^{18}$ | $2.0 \times 10^{18}$ | | |

TABLE 2. The principal properties and the results of the lasing measurements of the crystals

| Crystal | Prototype | N 1 | N 2 | N 3 | N 4 | N 5 | N 6 | N 7 |
|---|---|---|---|---|---|---|---|---|
| Density, g/cm$^3$ | 6.267 | 6.659 | 7.286 | 6.364 | 7.171 | 6.779 | 6.948 | 6.907 |
| Lattice parameter, nm | 12.40 | 12.41 | 12.63 | 12.40 | 12.38 | 12.45 | 12.43 | 12.42 |
| Passive absorption at 0.8 - 1.3 μm, cm$^{-1}$ | 0.018 | <0.01 | 0.015 | <0.01 | <0.01 | <0.01 | 0.011 | <0.01 |
| Gain coefficient, cm$^{-1}$ | 0.01 | 0.03 | - | 0.15 | 0.05 | 0.08 | - | - |
| Lasing efficiency, % | 0.1 | 0.26 | - | 0.45 | 0.31 | 0.4 | - | - |
| Lasing threshold, J | 20 | 18 | - | 12 | 16 | 17 | - | - |
| $^5I_6$ level of Ho$^{3+}$ ions lifetime, μsec | 470 | - | 440 | 420 | - | 490 | 420 | 350 |